United States Patent
Eichner et al.

(10) Patent No.: US 9,875,651 B2
(45) Date of Patent: Jan. 23, 2018

(54) ELECTRONIC OPERATING DATA MEMORY FOR A ROTATIONALLY OPERATING MACHINE

(71) Applicant: Robert Bosch GmbH, Stuttgart (DE)

(72) Inventors: Wilfried Eichner, Wildberg (DE); Daniel Hast, Stuttgart (DE); Bjoern Beuter, Hirrlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/205,306

(22) Filed: Jul. 8, 2016

(65) Prior Publication Data
US 2017/0011622 A1 Jan. 12, 2017

(30) Foreign Application Priority Data

Jul. 8, 2015 (DE) .......................... 10 2015 212 728

(51) Int. Cl.
*G06K 7/10* (2006.01)
*H04B 7/00* (2006.01)
(Continued)

(52) U.S. Cl.
CPC ......... *G08C 17/02* (2013.01); *G06F 12/1458* (2013.01); *G06K 7/10316* (2013.01);
(Continued)

(58) Field of Classification Search
CPC ........... H04Q 2209/40; H04Q 2209/60; H04Q 2209/43; H04Q 2209/47; H04Q 9/00; G06K 19/005; G06K 19/025; G06K 19/0723; G06K 19/07749; G06K 19/07747; G06K 7/10316; G06Q 10/06; G06Q 10/06313; G07B 15/06; G07B 15/063; G07C 5/008; G06F 12/1458; G06F 2212/1052; G08C 17/02; G08C 2201/93; H04W 4/008;
(Continued)

(56) References Cited

U.S. PATENT DOCUMENTS

2009/0153304 A1* 6/2009 Sands ................. H01Q 1/2208
340/10.4
2011/0310542 A1* 12/2011 Welch ................. G07B 15/063
361/679.01

(Continued)

FOREIGN PATENT DOCUMENTS

DE 197 30 492 A1 2/1999

OTHER PUBLICATIONS

Electronic RFID Nameplate for electric motors at ZF Saarbrücken (http://www.rfid-ready.de/200809222435/elektronisches-rfid-typenschild-fuer-elektromotorenbei-zf-saarbruecken.html); Sharma, Tarun; Accessed on Jul. 8, 2016; 1 page.

*Primary Examiner* — Dionne H Pendleton
(74) *Attorney, Agent, or Firm* — Maginot, Moore & Beck LLP

(57) ABSTRACT

Disclosed is an electronic operating data memory for a rotationally operating machine, with a transceiver device for the contactless transmitting and/or receiving of data, it being possible for operating data of the machine that are stored on the operating data memory to be read out and/or overwritten by means of a mobile terminal. The operating data include data that relate to the rotational operating principle of the machine and can be monitored and displayed by means of the mobile terminal.

10 Claims, 1 Drawing Sheet

(51) Int. Cl.

| | |
|---|---|
| *G08C 17/02* | (2006.01) |
| *G06F 12/14* | (2006.01) |
| *H04W 76/02* | (2009.01) |
| *H04W 4/00* | (2009.01) |
| *H01Q 1/22* | (2006.01) |
| *G06K 19/077* | (2006.01) |
| *H05K 9/00* | (2006.01) |
| *H04Q 9/00* | (2006.01) |

(52) U.S. Cl.
CPC ..... *G06K 19/07747* (2013.01); *H01Q 1/2216* (2013.01); *H01Q 1/2225* (2013.01); *H04Q 9/00* (2013.01); *H04W 4/008* (2013.01); *H04W 76/023* (2013.01); *H05K 9/0081* (2013.01); *G06F 2212/1052* (2013.01); *G08C 2201/93* (2013.01); *H04Q 2209/43* (2013.01); *H04Q 2209/47* (2013.01)

(58) Field of Classification Search
CPC .. H04W 76/023; H04W 84/12; H01Q 1/2216; H01Q 1/2225; H05K 9/0081
See application file for complete search history.

(56) References Cited

U.S. PATENT DOCUMENTS

| | | | |
|---|---|---|---|
| 2012/0075092 A1* | 3/2012 | Petite | G08B 25/009 340/539.1 |
| 2015/0019280 A1* | 1/2015 | Mejegard | G06Q 10/06 705/7.23 |
| 2015/0135239 A1* | 5/2015 | Oh | H04N 21/43637 725/81 |
| 2015/0302738 A1* | 10/2015 | Geerlings | G08C 17/02 340/5.25 |
| 2016/0110639 A1* | 4/2016 | Finn | G06K 19/07788 235/439 |
| 2017/0196128 A1* | 7/2017 | Elizondo, II | A61B 50/18 |

* cited by examiner

ELECTRONIC OPERATING DATA MEMORY
FOR A ROTATIONALLY OPERATING
MACHINE

This application claims priority under 35 U.S.C. §119 to application no. DE 10 2015 212 728.1, filed on Jul. 8, 2015 in Germany, the disclosure of which is incorporated herein by reference in its entirety.

BACKGROUND

The disclosure relates to an electronic operating data memory. The disclosure also relates to a machine with the electronic operating data memory according to the disclosure.

Conventional type plates for machines, in particular rotationally operating machines, are usually attached on the outside to a housing of the machine, for example are riveted on or adhesively attached. Data such as the works number, type and the like are printed onto the type plate, for example as a barcode and/or QR code and/or data matrix code and/or in plain script. For reasons of space, it is usually not possible to find room for further important data of such a machine on the type plate, in particular data concerning the product life cycle, such as for example service information or application-specific data. A further disadvantage of conventional type plates is that they usually become unreadable over time, for example because of corrosion, soiling or damage. It is also disadvantageous that conventional type plates can only be printed on once and the data on them cannot be changed or adapted. Manipulations by unauthorized exchange of the conventional type plate are also not evident, or not at first glance. Furthermore, with a conventional type plate there are no possible ways of protecting components or individual parts of the machine that are provided on the machine and/or in the user system from unauthorized exchange.

To avoid the aforementioned disadvantages, DE 197 30 492 A1 describes a digital type plate for electrically and hydraulically adjustable hydrostatic drives in which a memory unit is integrated and the data that are present on the memory unit can be read out and/or overwritten by way of an interface, which is formed as a serial bus system.

The publication of Sep. 22, 2008 on the website www.R-FID-ready.de/200809222435/elektronisches-RFID-typens-child-fuer-elektromotoren-bei-zf-saarbruecken.html discloses an electronic RFID (radio frequency identification) type plate for electric motors at ZF in Saarbrücken. Electric motors were fitted with RFID transponders, on which master data can be stored.

SUMMARY

Against this background, the disclosure is based on the object of providing an electronic operating data memory for a rotationally operating machine by means of which functions that are characteristic of such machines can be monitored and displayed.

This object is achieved by an electronic operating data memory with the features of disclosure.

A further object of the disclosure is that of providing a rotationally operating machine with an electronic operating data memory by means of which functions that are characteristic of such machines can be monitored and displayed.

This object is achieved by a machine with the features of the disclosure.

An electronic operating data memory according to the disclosure for a rotationally operating machine includes a transceiver device for the contactless transmitting and/or receiving of data, it being possible for operating data of the machine that are stored on the operating data memory to be read out and/or overwritten by means of a mobile terminal. The operating data include data that relate to the rotational operating principle of the machine and can be monitored, altered and/or displayed by means of the mobile terminal.

One advantage of the electronic operating data memory according to the disclosure is the ease with which characteristic operating data stored on the operating data memory can be read out or overwritten, for example by means of the mobile terminal. It is consequently ensured in an easy way that the characteristic operating data, in particular characteristic of a rotationally operating machine, can be kept up to date and referred to.

For the purposes of the present disclosure, operating data are typical data of the machine, such as for example the machine type, serial number, year of construction, works number, swept volume, direction of rotation, controller setting, such as for example flow under pressure/delivery, testbed settings, settings altered when starting up or during operation, maintenance work carried out, exchange of machine components, identification numbers of machine components, performance parameters, customer-specific data, and the like.

The transceiver device may have a transponder tag, which may be arranged outside on a housing of the machine, or inside a housing of the machine, or in the machine.

The housing of the rotationally operating machine may be at least partially produced from a metallic material, the transponder tag advantageously being arranged on or in part of the housing of the machine, in particular in a housing wall. Consequently, the transceiving performance of the transponder tag is not impaired because of a shielding effect of the metallic housing material.

Advantageously, the transponder tag has an RFID transponder, the RFID transponder being arranged in a transponder housing between an upper part of the transponder housing and a lower part of the transponder housing. Also advantageously, a shielding device is arranged between the lower part and the RFID transponder. In particular, the transponder housing consists of a nonmetallic material, and/or an electrically nonconducting material and/or a magnetically nonconducting material, in particular of a plastic. Advantageously, the shielding device is formed as a shielding film, which consists of a composite material, in particular of a polymer that is mixed with ferrite powder. It is ensured by this particular structure of the transponder tag that the transceiving performance of the transponder tag is not impaired by a shielding effect of a metallic material even when the transponder tag is attached, in particular with its lower part, on a metal object, for example the housing of the machine. In particular, the operating data can be stored on the RFID transponder. The RFID transponder may contain a memory chip and/or an antenna and/or a device for the mechanical fixing of these components.

The shielding film may be formed from an electrically poorly conducting or nonconducting material and/or from a material with a high magnetic conductivity. Consequently, eddy current losses can be reduced and/or a magnetic concentration of a near field is made possible, in particular for near field communication.

Advantageously, a web is formed by means of a region of the transporter housing, in particular of the lower part and of the upper part, that is formed in particular in an annular or square or rectangular or oval manner and projects beyond the transponder. In particular, a transceiving range is variable in proportion to a size of the web. Consequently, the transceiving range can be adapted according to the prevailing conditions by way of the size of the web, since the larger the web, the greater the transceiving range of the RFID transponder, and vice versa.

Advantageously, a top layer on the transponder tag is of a nonmetallic material, and/or an electrically nonconducting material, and/or a magnetically nonconducting material, in particular of a plastic and/or of a lacquer layer. Consequently, the transponder tag can be additionally protected from environmental influences and/or can be adapted or configured visually, in particular in such a way that the transponder tag is not directly visually evident.

In particular, the top layer of the transponder tag is formed as a conventional type plate. Consequently, data that are typical of a conventional type plate can be printed on or applied to the top layer and an extended function as it were, provided by means of the transponder tag, of the outwardly conventional type plate is not visually evident.

The conventional type plate and the transponder and the shielding film may be formed in each case separately from one another, or be formed as one piece with one another in the various combinations. Consequently, there is a flexibility in the production of the transponder tag according to the disclosure.

Advantageously, the data relating to the rotational operating principle of the machine include in particular a swept volume, a direction of rotation, a setting of a controller, for example a flow under pressure/delivery, an engine type and/or a pump type. Consequently, data that are important for operation of the machine on the basis of the rotational operating principle can be stored or monitored and/or displayed, and/or adapted to different conditions.

Advantageously, a wireless data connection can be established between the transponder and the mobile terminal, in particular an active or passive RFID data connection and/or an NFC (Near Field Communication) data connection and/or a WLAN (Wireless Local Area Network) data connection and/or a Bluetooth data connection and/or a data radio connection. Consequently, easy reading out and/or overwriting of the data contained on the electronic operating data memory is further assisted.

Advantageously, the transceiver device or the transponder tag contains a transponder, formed as an RFID transponder, a passive RFID transponder being less costly to produce. In the case of an active RFID transponder, the transceiver range is increased and a data connection, for example to the Internet, is possible during operation.

Advantageously, the operating data can be read out and/or overwritten and/or monitored and/or displayed and/or further processed and/or recorded by means of the mobile terminal and/or paired encryption algorithms on the transponder and the terminal exclusively after authorization. It is consequently ensured that these data can only be accessed by persons authorized to do so, in particular after part of the machine has been exchanged or after data and/or parameters that are important for operation of the machine have been changed.

In particular, part of the operating data stored on the electronic operating data memory is unchangeable, such as for example a serial number of the machine and/or of the RFID transponder. Consequently, in particular product piracy and/or unauthorized interventions can be effectively prevented.

Advantageously, the mobile terminal is formed as a portable computer, in particular as a notebook with or without an external reader, a tablet computer with or without an external reader or as a smartphone with or without an external reader. It is consequently ensured that the data stored on the operating data memory according to the disclosure can be handled with mobile terminals that are nowadays in widespread use.

Advantageously, a program that is or can be specifically designed for the machine can be run on the mobile terminal. For the purposes of the present disclosure, the "program" that can be run on the mobile terminal is a mobile application that can be stored and/or run on the mobile terminal, and/or a service that is available online, such as for example an ordering of spare parts that can be initiated by means of the mobile terminal via the Internet or some other data connection, maintenance requests or the like. Consequently, the operating data of the machine that are stored on the operating data memory can be read out, and/or overwritten and/or monitored and/or displayed and/or further processed and/or recorded in an optimized manner, in particular after authorization.

Advantageously, the operating data can be stored, in particular by means of the mobile terminal, in an accessible, in particular centrally accessible, separate memory, for example in an Internet memory (cloud), an external memory that can be reached by way of a wire-bound or wireless data connection, and/or a memory of a networkable single computer. Consequently, the operating data can be accessed remotely in an easy way, in particular after authorization.

Advantageously, statistics of the machine over a maintenance cycle and/or over a lifetime cycle can be prepared by means of the operating data. Consequently, the frequency of faults and/or histories of faults can be documented in an easy way.

Advantageously, the statistics can be supplemented by the corresponding data after an authorized intervention in the machine. For example, after spare parts have been exchanged, settings and/or parameters of the machine have been changed. It can consequently also be established whether spare parts have been exchanged for original replacement parts.

Advantageously, the operating data can be made available to a higher-level file system. Consequently, in particular after authorization, the operating data can be accessed centrally.

In addition to the operating data, other typical data concerning the rotationally operating machine, such as for example operating instructions, data sheets, parts lists, service activities and/or the like, can also be stored in an accessible, in particular centrally accessible, separate memory. Using the mobile terminal, these data can be accessed worldwide, under password protection.

A rotationally operating machine according to the disclosure includes an electronic operating data memory according to the present disclosure, it being possible for the rotationally operating machine to be formed as a hydrostatic displacement unit, in particular as a hydraulic motor or as a hydraulic pump, more particularly as an axial piston machine or as a radial piston machine, or as a transmission, or as a turbine, or as an internal combustion engine, or as a compressor, or as a generator. Consequently, the advantages of the present disclosure can be applied to different types of machine.

Advantageously, the transponder housing is arranged on the housing, with the lower part facing the housing. Consequently, trouble-free functioning of the transponder tag is ensured, in particular in combination with a housing of at least partially metallic material.

BRIEF DESCRIPTION OF THE DRAWINGS

Exemplary embodiments of the disclosure are presented in the drawings an are explained in more detail in the description below.

In the drawings.

DETAILED DESCRIPTION

Figure 1:
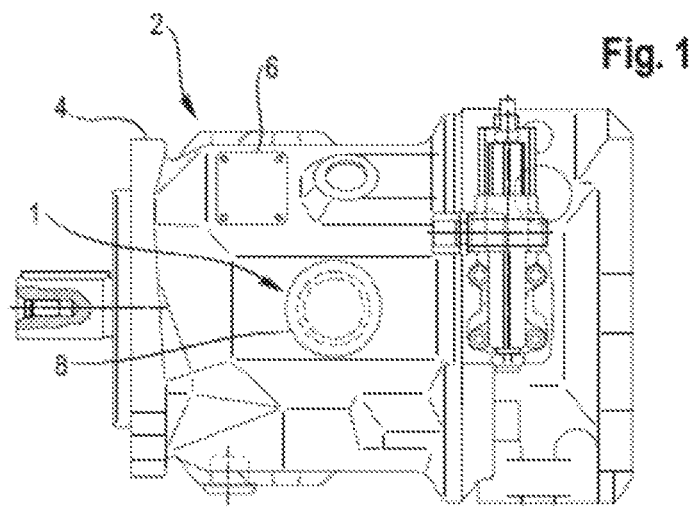
FIG. 1 shows an electronic operating data memory on a rotationally operating machine according to a first exemplary embodiment.

The electronic operating data memory 1 according to the disclosure that is shown in FIG. 1 is attached to a rotationally operating machine 2, to be more precise to a housing 4 of the machine 2. Likewise attached to the housing 4 is a conventional type plate 6.

Figure 2A:
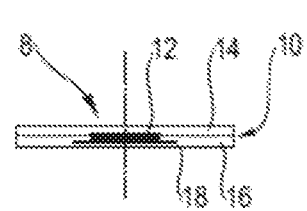
FIG. 2a shows a cross section through a transponder tag according to the disclosure.
Figure 2B:
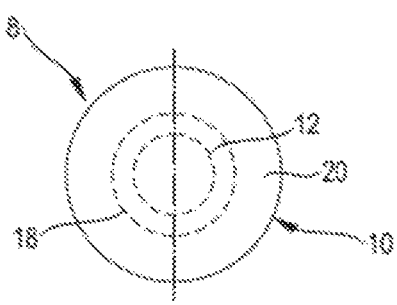
FIG. 2b shows a plan view of the transponder tag according to the disclosure as shown in FIG. 2a, FIG. 3 shows a cross section through a transponder tag according to the disclosure, recessed in a housing of a rotationally operating machine.

The electronic operating data memory 1 includes a transceiver device 8, which is formed as a transponder tag. As shown in FIG. 2a, the transponder tag 8 includes a transponder housing 10 and an RFID transponder 12, which is arranged between an upper part 14 of the transponder housing 10 and a lower part 16 of the transponder housing. Arranged between the RFID transponder 12 and the lower part 16 is a shielding device 18 formed as a shielding film, so that the RFID transponder 12 is not in direct contact with the lower part 16, but by way of the shielding film 18. The shielding film 18 projects beyond the RFID transponder 12 in the radial direction, but as an alternative to this may finish in the radial direction with the RFID transponder 12. The shielding film 18 consists of a polymer that is mixed with ferrite powder. The upper part 14 and the lower part 16 project beyond the RFID transponder 12 in the radial direction and thus form a web 20 around the RFID transponder 12, as shown in FIG. 2b. The RFID transponder 12 and the shielding film 18 are represented by dashed lines in FIG. 1 and FIG. 2b, that is to say that they are not visible because they are not within the section.

Figure 3:
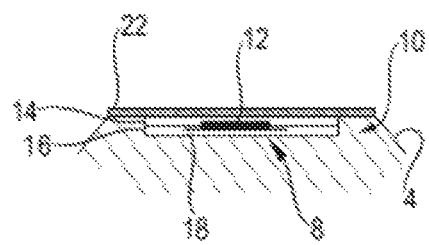

It is shown in FIG. 3 how the transponder tag 8 is integrated in the housing 4, here in a housing wall. The transponder tag 8 lies with its lower part 16 in the direction of the machine 2 in a recess of the housing 4, which may for example be allowed for during the casting of the housing 4 or can be produced by milling. In order to protect the transponder tag 8 from environmental influences, it is provided with a top layer 22, for example a lacquer, with which the housing 4 is lacquered, or some other plastic coating. If a non-transparent lacquer or plastic coating is used, the transponder tag 8 is consequently no longer directly visible from the outside.

Figure 4:
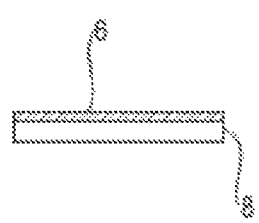
FIG. 4 shows a cross section through a transponder tag according to the disclosure under a conventional type plate.

In FIG. 4, an alternative manner of attaching the transponder tag 8 is shown, specifically under the conventional type plate 6 that is shown in FIG. 1. Also with this manner of attachment, the transponder tag 8 is not externally visible. With the material of the type plate 6 being chosen such that a transceiving performance of the RFID transponder 12 is not impaired, the type plate 6 consists in particular of a plastic that is neither electrically nor magnetically conducting and has no shielding effect on the RFID transponder 12. The same applies to the lacquer or plastic coating described in relation to FIG. 3 that forms the top layer 22.

The transponder tag with or without the transponder housing 10 may be mounted, adhesively attached or riveted onto the housing.

The possibilities of attachment as shown in FIG. 3 and in FIG. 4 can also be combined with one another, that is to say that a type plate 6 can be attached as an alternative or in addition to the top layer 22 over a transponder tag 8 integrated in the housing 4, without impairing the transceiving performance of the RFID transponder 12.

It applies to all of the exemplary embodiments shown that data relating in particular to the rotational operating principle of the machine 2 (operating data) can be stored on the RFID transponder 12 and can be read out and/or overwritten by means of a mobile terminal that is not shown.

Disclosed is an electronic operating data memory for a rotationally operating machine that includes a transceiver device for the contactless transmitting and/or receiving of data. Operating data of the machine, in particular data relating to the rotational operating principle of the machine and/or service data, can be stored on the electronic operating data memory, in particular on an RFID transponder contained therein, and can be read out and/or overwritten by means of a mobile terminal. Furthermore, the stored data can be retrieved, in particular by means of the mobile terminal, from a database accessible by way of a network connection and used for various services, such as for example ordering of spare parts and/or maintenance requests.

LIST OF DESIGNATIONS

1 Electronic operating data memory
2 Rotationally operating machine
4 Housing
6 Conventional type plate
8 Transceiver device/transponder tag
10 Transponder housing
12 RFID transponder
14 Upper part of the transponder housing
16 Lower part of the transponder housing
18 Shielding device/shielding film
20 Web
22 Top layer

What is claimed is:

1. An electronic operating data memory for a rotationally operating machine, the electronic operating data memory comprising:
  a transceiver device configured to at least one of contactlessly transmit and contactlessly receive data, the transceiver device being formed as an RFID transponder tag,
  a housing of the rotationally operating machine formed from a metallic material and at least one of a nonmetallic material, an electrically nonconducting material, and a magnetically nonconducting material, the housing further comprising:
    an upper part and a lower part;
    the RFID transponder tag being arranged within the housing between the upper part and the lower part of the housing; and
    a shielding device arranged between the lower part of the housing and the RFID transponder tag, wherein the electronic operating data memory is configured to store at least one of operating data and service data of the rotationally operating machine, the at least one of the operating data and the service data including data relating to a rotational operating principle of the rotationally operating machine, and wherein the transceiver device is configured to enable a mobile terminal to (i) at least one of read out and overwrite the at least one of the operating data and the service data (ii) monitor the at least one of the operating data and the service data, and (iii) display the at least one of the operating data and the service data.

2. The electronic operating data memory according to claim 1, wherein the shielding device is formed as a shielding film comprising a polymer mixed with ferrite powder.

3. The electronic operating data memory according to claim 1, wherein:
a web is formed by a region of the housing that projects beyond the RFID transponder tag; and
a transceiver range of the RFID transponder tag is variable in proportion to a size of the web.

4. The electronic operating data memory according to claim 1, wherein the data relating to the rotational operating principle of the rotationally operating machine includes at least one of (i) a swept volume, (ii) a direction of rotation, (iii) a setting of a controller, (iv) a machine type, (v) a motor type, and (vi) a pump type.

5. The electronic operating data memory according to claim 1, wherein:
the RFID transponder tag is configured to establish a wireless data connection with the mobile terminal using at least one of (i) RFID, (ii) NFC, (iii) WLAN, and (iv) Bluetooth; and
the mobile terminal is formed as one of (i) a portable computer, (ii) a notebook, (iii) a tablet computer, and (iv) a smartphone.

6. The electronic operating data memory according to claim 1, wherein a program that is specifically designed for the rotationally operating machine is stored and run on the mobile terminal.

7. The electronic operating data memory according to claim 1, wherein the at least one of the operating data and the service data is stored in a separate memory that is accessible by way of at least one of a wire-bound data connection and a wireless data connection.

8. The electronic operating data memory according to claim 1, wherein the transceiver device is configured to enable the mobile terminal to (i) at least one of read out and overwrite the at least one of the operating data and the service data only after authorization of the mobile device.

9. A rotationally operating machine comprising:
an electronic operating data memory comprising:
a transceiver device being formed as an RFID transponder tag configured to at least one of contactlessly transmit and contactlessly receive data; and
a housing holding the RFID transponder tag, the housing being at least partially formed from a metallic material and a top layer of at least one of a nonmetallic material, an electrically nonconducting material, and a magnetically nonconducting material arranged on the RFID transponder tag, the top layer being formed as at least one of a conventional type plate and a lacquer layer;
wherein the electronic operating data memory is configured to store at least one of operating data and service data of the rotationally operating machine, the at least one of the operating data and the service data including data relating to a rotational operating principle of the rotationally operating machine, and
wherein the transceiver device is configured to enable a mobile terminal to (i) at least one of read out and overwrite the at least one of the operating data and the service data (ii) monitor the at least one of the operating data and the service data, and (iii) display the at least one of the operating data and the service data,
wherein the rotationally operating machine is formed as one of (i) a hydrostatic displacement unit, (ii) a transmission, (iii) a turbine, and (iv) an internal combustion engine.

10. An electronic operating data memory for a rotationally operating machine, the electronic operating data memory comprising:
a transceiver device configured to at least one of contactlessly transmit and contactlessly receive data, the transceiver device being formed as an RFID transponder tag; and
a housing of the rotationally operating machine at least partially formed from a metallic material, the housing having an upper part and a lower part with the RFID transponder tag being arranged between the upper part and the lower part of the housing, the housing further comprising:
a web formed by a region of the housing that projects beyond the RFID transponder tag; and
a transceiver range of the RFID transponder tag is variable in proportion to a size of the web;
wherein the electronic operating data memory is configured to store at least one of operating data and service data of the rotationally operating machine, the at least one of the operating data and the service data including data relating to a rotational operating principle of the rotationally operating machine, and
wherein the transceiver device is configured to enable a mobile terminal to (i) at least one of read out and overwrite the at least one of the operating data and the service data (ii) monitor the at least one of the operating data and the service data, and (iii) display the at least one of the operating data and the service data.

* * * * *